US011909512B1

(12) United States Patent
Jia et al.

(10) Patent No.: US 11,909,512 B1
(45) Date of Patent: Feb. 20, 2024

(54) METHODS OF INJECTION LOCKING FOR MULTIPLE OPTICAL SOURCE GENERATION

(71) Applicant: CABLE TELEVISION LABORATORIES, INC., Louisville, CO (US)

(72) Inventors: Zhensheng Jia, Superior, CO (US); David Daniel Smith, Boulder, CO (US); Junwen Zhang, Shanghai (CN); Luis Alberto Campos, Superior, CO (US); Curtis D. Knittle, Superior, CO (US)

(73) Assignee: CABLE TELEVISION LABORATORIES, INC., Louisville, CO (US)

( * ) Notice: Subject to any disclaimer, the term of this patent is extended or adjusted under 35 U.S.C. 154(b) by 0 days.

(21) Appl. No.: 17/690,760

(22) Filed: Mar. 9, 2022

Related U.S. Application Data

(60) Provisional application No. 63/158,762, filed on Mar. 9, 2021.

(51) Int. Cl.
| | |
|---|---|
| *H04B 10/50* | (2013.01) |
| *H04J 14/00* | (2006.01) |
| *H01S 5/40* | (2006.01) |
| *H04B 10/80* | (2013.01) |

(52) U.S. Cl.
CPC .......... *H04J 14/002* (2013.01); *H01S 5/4006* (2013.01); *H04B 10/506* (2013.01); *H04B 10/5053* (2013.01); *H04B 10/80* (2013.01); *H04B 10/505* (2013.01)

(58) Field of Classification Search
None
See application file for complete search history.

(56) References Cited

U.S. PATENT DOCUMENTS

| | | | | |
|---|---|---|---|---|
| 7,706,688 | B2 * | 4/2010 | Boudreault | H04J 14/0216 398/59 |
| 8,086,102 | B2 * | 12/2011 | Kim | H04J 14/02 398/67 |
| 8,644,708 | B2 * | 2/2014 | Cheng | H04J 14/02 398/79 |
| 9,804,026 | B2 * | 10/2017 | Jarrahi | H01L 33/38 |
| 9,912,409 | B2 * | 3/2018 | Jia | H04J 14/04 |
| 10,200,123 | B2 * | 2/2019 | Campos | H04B 10/25753 |
| 10,601,513 | B2 * | 3/2020 | Campos | H04B 10/64 |
| 10,623,104 | B2 * | 4/2020 | Zhou | H04B 10/502 |

(Continued)

OTHER PUBLICATIONS

Single Frequency Lasers Tutorial: External Cavity Diode Lasers, Thorlabs, 2020 (Year: 2020).*

*Primary Examiner* — Jai M Lee
(74) *Attorney, Agent, or Firm* — COZEN O'CONNOR

(57) ABSTRACT

A coherent optical injection locking (COIL) apparatus generates multiple optical source outputs from a single optical source generated by a parent laser. The COIL apparatus includes a plurality of optical source generators each having a child laser, of lesser performance than the parent laser, that is injection locked to the single optical source. The optical source generators may have one or both of a shared configuration and a cascaded configuration that replicates the single optical source, or a single wavelength of the single optical source when it is a comb source.

13 Claims, 11 Drawing Sheets

(56) References Cited

U.S. PATENT DOCUMENTS

| | | | |
|---|---|---|---|
| 10,944,478 B2* | 3/2021 | Zhang | H04B 10/504 |
| 11,112,310 B2* | 9/2021 | Anandarajah | G01J 3/427 |
| 11,394,466 B2* | 7/2022 | Campos | H04J 14/0246 |
| 11,418,263 B2* | 8/2022 | Zhang | G02B 27/286 |
| 2018/0287709 A1* | 10/2018 | Lu | H04B 10/524 |

* cited by examiner

METHODS OF INJECTION LOCKING FOR MULTIPLE OPTICAL SOURCE GENERATION

RELATED APPLICATION

This application claims priority to U.S. Patent Application Ser. No. 63/158,762, titled "Methods of Injection Locking for Multiple Optical Sources Generation," filed Mar. 9, 2021, and incorporated herein by reference.

BACKGROUND

Passive optical networks (PON) have evolved greatly and rapidly over the last two decades and represent one of the most attractive access network solutions for delivering high-speed data and video services. Each of first generation BPONs (Broadband Passive Optical Networks), GPONs (Gigabit Passive Optical Networks), and EPON (Ethernet Passive Optical Networks) relied on relatively basic and relaxed specifications on the components. PON standards have since evolved into 10 Gbit/s Ethernet PON and 10-Gigabit-capable PON (XGPON) with tightened tolerances. More recently, the Next-Generation PON 2 (NG-PON2) and 100G-EPON, which are the migration from current deployed PON standard systems such as GPON and E-PON, are aimed at supporting increasing bandwidth demands. In this sense, time-division multiplexing (TDM) and wavelength division multiplexing (WDM) have been utilized to balance the cost and performance flexibility path, and thus multiple single-mode optical light sources are required for this type of PON architectures at high cost. However, due to the continued growth of various end-user demands and highly time-varying traffic, other degrees of flexibility are required.

SUMMARY

Coherent technologies have been recently considered as the most effective future-proof approach for optical access networks in both brown and green field deployments. Thanks to the advancements in digital signal processing (DSP), digital coherent detection enables superior receiver sensitivity that allows an extended power budget and high frequency selectivity enabling closely space dense/ultra-dense wave division multiplexing (WDM) without the need of narrow-band optical filters. Moreover, the multi-dimensional recovered coherent optical signal provides additional benefits to compensate linear transmission impairments such as chromatic dispersion (CD) and polarization-mode dispersion (PMD). The efficient utilization of spectral resources facilitates future network upgrades through the use of multi-level advanced modulation formats. In the cable access environment, coherent optics allows operators to leverage the existing fiber infrastructure to withstand the exponential growth in capacity and services. However, there are several engineering challenges of introducing digital coherent technologies into optical access networks. The access network is a totally different environment as compared to long haul and metro. To reduce the power consumption and thereby meet the size and cost requirements for access applications, development of optics is essential.

In one embodiment, a coherent optical injection locking (COIL) system includes a plurality of optical source generators each having: a child laser; and an optical circulator coupled with the child laser to direct one of a plurality of injection locking signals to the child laser to cause the child laser to generate an optical source output that replicates the one injection locking signal.

In another embodiment, an injection locking method for multiple optical sources, includes receiving a single optical source; injection locking a plurality of optical source generators using the optical source; and generating, at each of the plurality of optical source generators, an optical source output having optical characteristics the same as the optical source.

In another embodiment, a method for using a single optical source in an optical communication network, includes: generating a single optical source at a hub of the optical communication network using a high-performance laser; transmitting the single optical source over a fiber cable to a fiber node of the optical communication network; generating at least two first optical sources using first coherent optical injection locking (COIL) within the fiber node, each of the at least two first optical sources having the same phase, wavelength, wavelength stability, and linewidth as the optical source; transmitting one of the two first optical sources to a first end user equipment; and generating at least two second optical sources using a second COIL within the first end user equipment, each of the at least two second optical sources having optical characteristics substantially equal to optical characteristics of the one first optical source.

In another embodiment, a method for using a single optical-frequency comb source in a data center having a server, an access switch, an aggregation switch, and a router, includes: generating the optical-frequency comb source using a high-performance optical laser at a first equipment of the data center; transmitting the optical-frequency comb source to the server, the access switch, the aggregation switch, and the router via at least one fiber cable; generating at least two first optical sources using the optical-frequency comb source and a first coherent optical injection locking (COIL) apparatus at the server; generating at least two second optical sources using the optical-frequency comb source and a second COIL apparatus at the access switch; generating at least two third optical sources using the optical-frequency comb source and a third COIL apparatus at the aggregation switch; generating at least two fourth optical sources using the optical-frequency comb source and a fourth COIL apparatus at the router; communicating between the server and the access switch using at least one of the two first optical sources and at least one of the two second optical sources; communicating between the access switch and the aggregation switch communicate using at least one of the two second optical sources and at least one of the two third optical sources; communicating between the aggregation switch and the router communicate using at least one of the two third optical sources and at least one of the two fourth optical sources; and each of the at least two first optical sources, the at least two second optical sources, the at least two third optical sources, the at least two fourth optical sources having optical characteristics substantially the same as optical characteristics of at least one wavelength of the optical-frequency comb source.

In another embodiment, a method for using a single optical source in a free-space optical (FSO) communication network, includes: receiving the single optical source; generating at least two optical sources using the optical source and a coherent optical injection locking (COIL) apparatus; applying a data modulation to each of the at least two optical sources; and transmitting the at least two optical sources from an optical antenna as a communication beam.

DETAILED DESCRIPTION OF THE EMBODIMENTS

Figure 1:
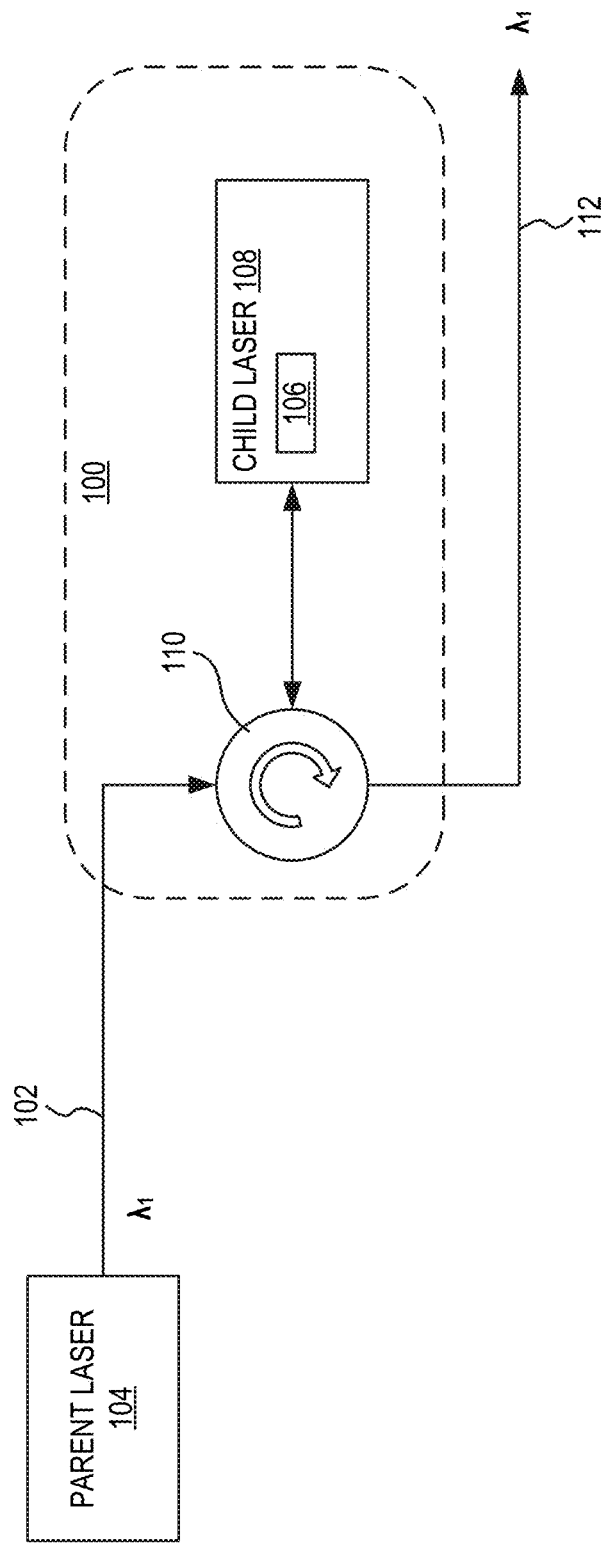
FIG. 1 is a schematic diagram illustrating one example optical source generator that uses coherent optical injection locking (COIL), in an embodiment.

A coherent optical system (e.g., a communication system) requires an optical source with characteristics such as a narrow linewidth (e.g., narrow signal bandwidth), high optical power, and very good wavelength stability, often referred to as a high-quality optical source or a high-performance optical source. These optical sources are generated by high-performance lasers and are used as transmitters and local oscillators, which, in a coherent communication system, are crucial building blocks and are a focus for optimizing the cost and performance of the coherent optical system. In a headend or hub of the coherent optical system, a high-performance laser is a source of an optical signal having a narrow spectral linewidth, a high optical power, and a stabile wavelength. A typical requirement of coherent optical systems is a wavelength stability between 100 KHz and 50 KHz. This high-performance laser may be an external cavity laser (ECL) that has an internal cavity that produces an optical signal that is further refined by an external cavity to provide the optical source for use in the coherent optical system. However, an ECL has a high cost and size for providing such optical characteristics. One aspect of the present embodiments includes the realization that it is undesirable to include a high-performance parent laser in each component of the coherent optical system. The present embodiments overcome this problem by using a low-cost, small-footprint laser (e.g., low-cost multi-mode Fabry-Perot (FP) laser diodes) within many components (e.g., optical nodes) of the coherent optical system, which saves cost and space. Another aspect of the present embodiments includes the realization that these low-cost lasers do not generate an optical signal of sufficient quality (e.g., narrow linewidth and stabile wavelength) for use in the coherent optical system and would degrade performance of the coherent optical system. The present embodiments overcome this problem by using optical locking to improve the quality of the optical signal from a child laser. U.S. Pat. No. 10,897,310, incorporated herein by reference, describes use of optical injection locking of a child laser to output an optical signal substantially of the same quality as the parent laser. U.S. Pat. No. 10,897,310 further teaches of a gain-switched optical frequency comb generation technique that may be used to generate an optical comb as described in detail below. However, other techniques for optical frequency comb generation may also be used.

As taught by US Patent Application Publication 2021/0336703 A1, titled "Fiber Communication Systems and Methods," incorporated herein by reference, a high-quality optical signal is transmitted on a downstream fiber link from a hub to end user equipment, and the high-quality optical signal is used to injection lock a child laser that generates an optical signal that is modulated to carry data on an upstream link from the end user equipment to the hub. One aspect of the present embodiments includes the realization that greater cost savings could be made by increasing the number of child lasers that are injection locked by an optical signal from a single high-performance parent laser. The following embodiments provide examples of using a single parent laser to injection lock multiple child lasers, thereby increasing the cost being saved.

FIG. 1 is a schematic diagram illustrating one example optical source generator 100 that uses coherent optical injection locking (COIL). Optical source generator 100 includes an optical circulator 110 and a child laser 108 with a laser resonator 106. COIL is a technique that causes a low-performance laser (e.g., child laser 108, such as low-cost multi-mode FP laser diodes) to generate an optical source comparable to one generated by a high-performing (e.g., high specification output) laser by through injection locking the low-performance laser using a high-performance optical source from a higher-performing (e.g., high-quality) parent laser 104. Injection locked child laser 108 performs similar to a high-performance laser and may be used in coherent optical systems. For example, a high-performance parent laser may have wavelength stability between 100 KHz and 50 kHz and a linewidth of 30 kHz to 100 kHz, whereas the low-performance child laser 108, when operating without injection locking, may have a wavelength stability between 5000 kHz and 3000 kHz, and a line width of between 3000 kHz and 8000 kHz or larger. However, such low-performance child lasers are much cheaper than the high-performance parent laser since they have a much simpler cavity design.

In the example of FIG. 1, a single frequency optical source 102, generated by parent laser 104 for example, is injected, via optical circulator 110, into laser resonator 106 of a child laser 108, which is usually with multi-longitudinal modes because the rather simple design of the resonant cavity. Child laser 108 then generates an optical source output 112, via optical circulator 110, that is substantially the same as single frequency optical source 102 but may have a greater amplitude. Thus, optical source generator 100 may operate as an optical amplifier of optical source 102. By injecting optical source 102 is into resonator 106 of child laser 108, child laser 108 is forced to follow the phase trend of optical source 102 and operates to increase the linear gain regime of the laser. Injecting optical source 102 into resonator 106 effectively reduces the laser linewidth of child laser 108 (e.g., as compared to a linewidth generated by child laser 108 when not injection locked), where optical source output 112 has the same characteristics (e.g., phase, wavelength, wavelength stability, and linewidth) as optical source 102. Optical source output 112 also has the same phase as optical source 102. Advantageously, optical source output 112 may have a greater amplitude than optical source 102, and thereby optical source generator 100 operates as an optical amplifier.

Integrated COIL

COIL apparatus is a term used for multiple injection locked optical source generators that generate multiple high-performance optical sources from a single optical source generated by a single high-performance laser. Traditional coherent optical systems use many optical sources generated by many high-performance lasers such as parent laser 104 of FIG. 1, since these optical sources are generated where needed throughout the coherent optical system. One aspect of the present embodiments includes the realization that optical sources generated by high-performance lasers are costly and often require protected environments to maintain the high-quality of optical outputs needed for fast optical communication. The present embodiments solve this problem by introducing a COIL apparatus and associated methods for distribution of a single (e.g., one) optical source, generated by a high-performance laser for example, throughout a coherent optical system. The COIL apparatus may be positioned anywhere (e.g., at locations/devices where the optical source is needed) in a coherent optical system and includes multiple optical source generators that each use a low-performance (as compared to a high-performance laser such as parent laser 104) child laser (e.g., child laser 108) to generate an optical source output that may be used for coherent optical communication (e.g., in a coherent optical communication network). The COIL apparatus replicates the single optical source using a structure of optical source generators 100, where each optical source generator generates one optical source output that has the same phase, same wavelength, same wavelength stability, and same linewidth as the single optical source, but at a greater amplitude. The following embodiments illustrate example configurations (e.g., structures of low-cost lasers) for the COIL apparatus to replicate a single high-performance optical source to provide multiple high-performance optical sources. The COIL apparatus may be integrated in a single photonic chip, having one or more child lasers, at least one optical circulator, and at least one coupling waveguide. Advantageously, the single photonic chip may be incorporated at relatively low cost (as compared to the cost of using multiple high-performance lasers) into individual components of the coherent optical system. Accordingly, these optical sources may be generated where needed at significantly reduced cost to the coherent optical system as compared to prior optical systems that required multiple high-performance lasers.

Advantageously, through use of these COIL apparatus, one single high-performance optical laser source (e.g., parent laser 104 of FIG. 1) may be used to injection lock many child lasers (e.g., child laser 108), whereby each child laser generates an optical source output that is suitable for use by the coherent optical system. Accordingly, through use of the COIL apparatus, the optical characteristics of one optical source generated by a high-performance laser may be replicated by many lesser-quality low-cost child lasers, thereby dramatically reducing the overall cost of the coherent optical system, since deployment of many high-performance, high-cost parent lasers at different components of the coherent optical system is avoided. Accordingly, COIL apparatus is a convenient and cost-effective building block for providing multiple optical sources for use in any optical system, such as coherent optical networks.

Shared COIL Apparatus

Figure 2:
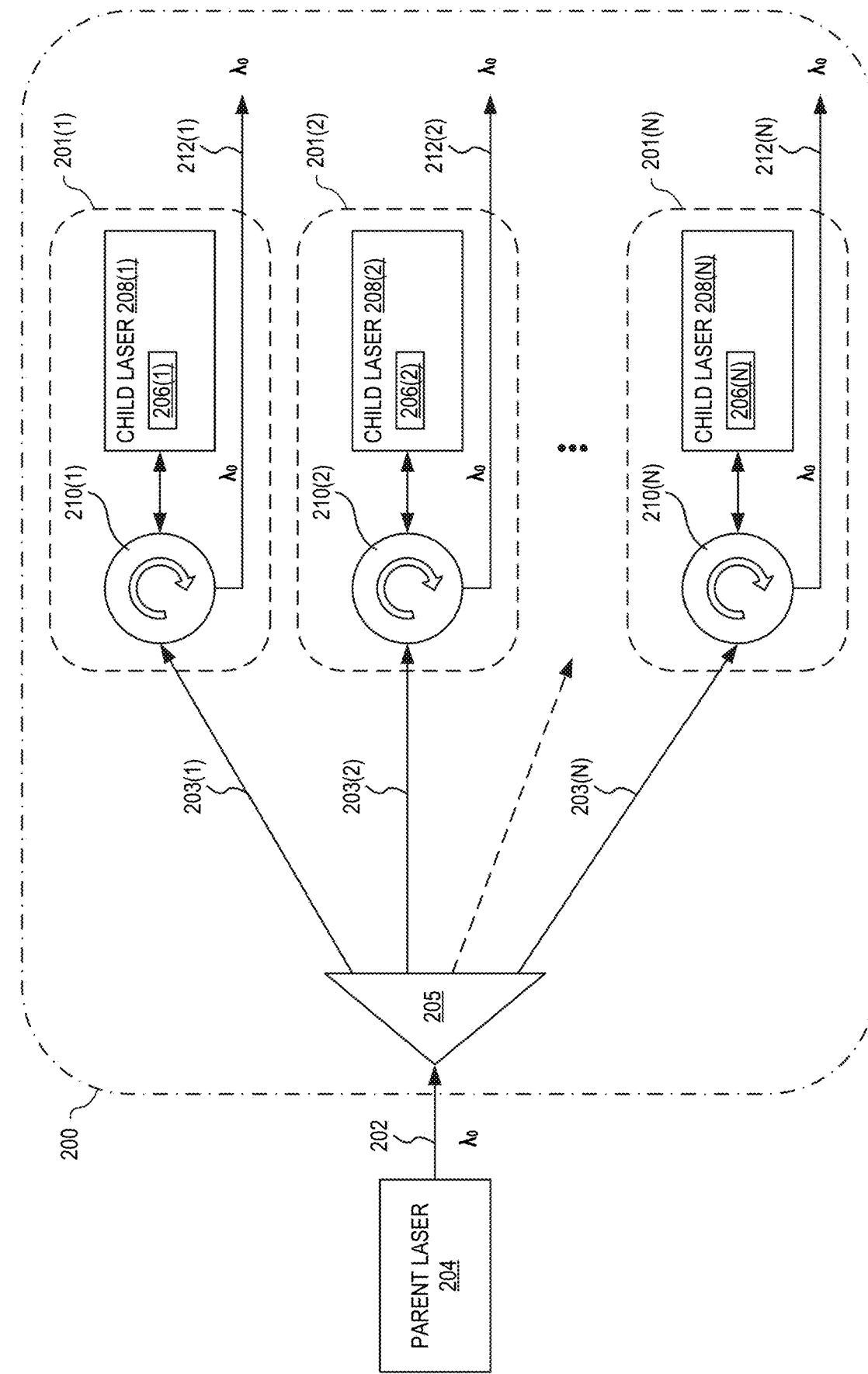
FIG. 2 is a schematic diagram illustrating one example COIL apparatus operating in a shared mode, in embodiments.

FIG. 2 is a schematic diagram illustrating one example COIL apparatus 200 operating in a shared mode, in embodiments. COIL apparatus 200 includes a 1:N optical power splitter 205 and a plurality of optical source generators 201(1)-(N). Optical power splitter 205 splits a single frequency optical source 202, received from a high-performance parent laser 204 for example, into a plurality of similar injection locking signals 203(1)-(N), each of which is used to injection lock one optical source generator 201. Each optical source generator 201 includes an optical circulator 210 and a child laser 208 with a corresponding laser resonator 206. Child laser 208 is injection locked by injection locking signal 203 causing child laser 208 to replicate single frequency optical source 202 and generate one optical source output 212 with the same phase, same wavelength, same wavelength stability, and same linewidth as single frequency optical source 202 and at a greater amplitude.

In this embodiment, the number of child lasers 208 that may be driven by single frequency optical source 202 is determined by a maximum output power of parent laser 204, a minimum injection locking power of each child laser 208, and a locking range. A ratio between output power of the parent laser and output power of the child laser is called an injection ratio. For higher injection ratios, injection locking of the child laser is more forgiving to frequency detuning between the parent and child lasers. An optimal locking range is a balance of injection power and the frequency detuning range. For example, where parent laser 204 is a typical ECL with +15 dBm output power, a split ratio of 1:32 or 1:64 may be supported. Accordingly, single optical source 202 from one parent laser 204 may drive up to sixty-four child lasers 208 to generate up to sixty-four optical source outputs 212, and maybe more in certain embodiments, where each optical source output 212 has the same optical characteristics (e.g., phase, wavelength, wavelength stability, and linewidth) as single optical source 202. Since COIL apparatus 200 also amplifies injection locking signals 203, direct modulation or external modulation may be applied to each optical source output 212. Advantageously, COIL apparatus 200 reduces cost of equipment in a coherent optical system since the cost of optical power splitter 205 and each optical source generator 201 is lower than the cost of using multiple parent lasers 204 to generate the multiple optical source outputs 212.

Figure 3:
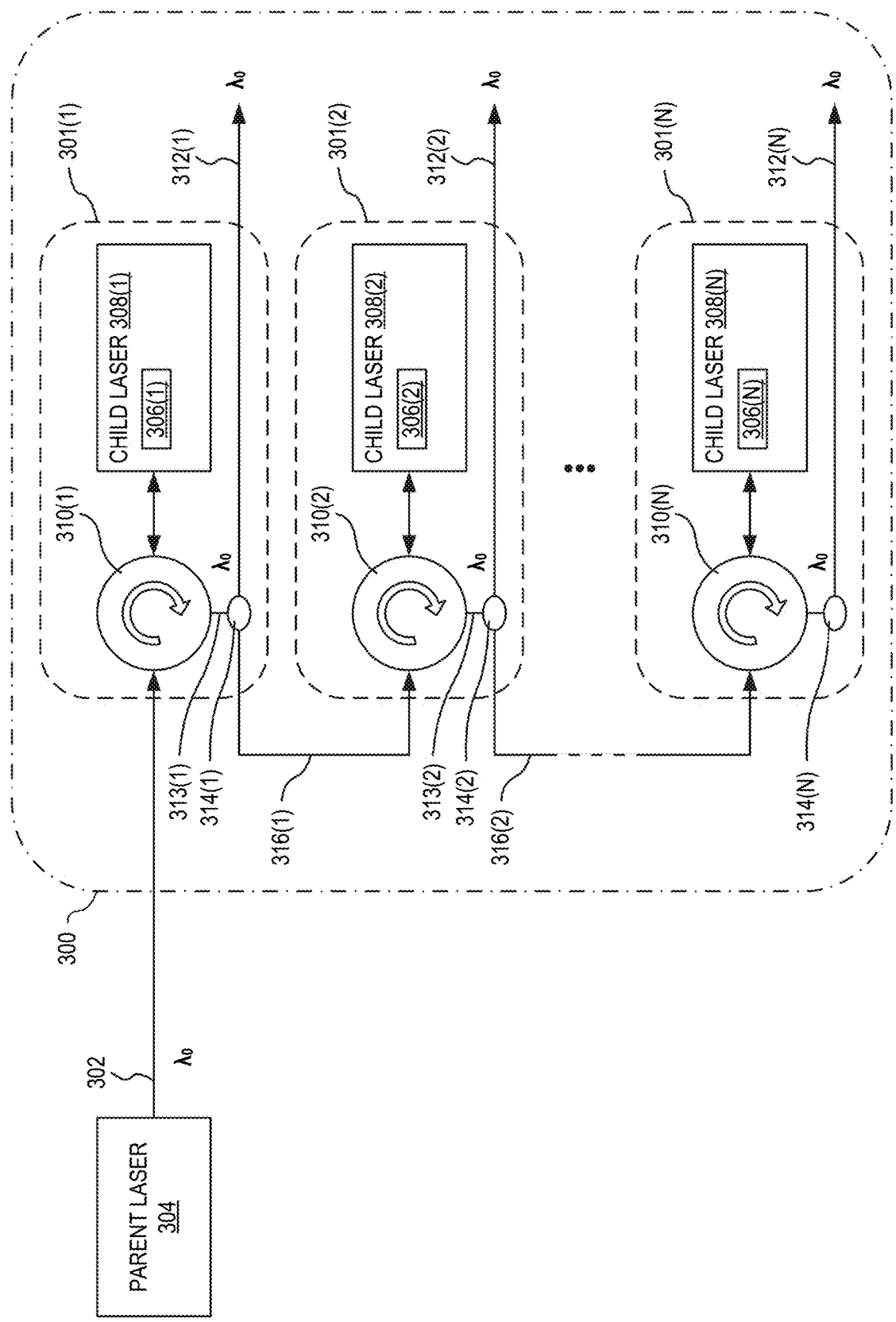
FIG. 3 is a schematic diagram illustrating one example COIL apparatus operating in a cascade mode, in embodiments.

FIG. 3 is a schematic diagram illustrating one example COIL apparatus 300 operating in a cascade mode. COIL apparatus 300 includes a plurality of optical source generators 301, each including an optical circulator 310 and a child laser 308 with a laser resonator 306 and a power splitter 314. A first optical source generator 301(1) receives a single frequency optical source 302, from a parent laser 304 in the example of FIG. 3, that is input into laser resonator 306 of child laser 308 via optical circulator 310. Accordingly, child laser 308(1) generates, via optical circulator 310(1), an optical output 313(1) that is split by power splitter 314(1)

into an optical source output 312(1) and an injection locking output 316(1). Optical source output 312(1) may be used in other components of the coherent optical system and injection locking output 316(1) may be used to injection lock a next child laser 308(2) (e.g., also referred to as a grandchild laser). Optical source generator 301(1) replicates single frequency optical source 302 to generate optical source output 312(1) with the same phase, the same wavelength, same wavelength stability, and same linewidth as single frequency optical source 302 but optionally with a greater amplitude. Optical source output 312(1) may be used by components of a coherent optical system (e.g., a coherent optical network), and has sufficient amplitude for direct external modulation without requiring additional optical amplification.

As compared to the shared mode of COIL apparatus 200, FIG. 2, where using a greater number of optical source generators 201 results in each injection locking signal 203 having reduced amplitude, COIL apparatus 300 has a high-power input budget for each optical source generator 301, since optical source 302 is input only to optical source generator 301(1), which generates injection locking output 316(1) that drives a subsequent optical source generator 301(2), and so on (e.g., child laser drives grandchild laser, which drives great grandchild laser, and so on). Injection locking output 316 from each optical source generator 301 also replicates optical characteristics (e.g., phase, wavelength, wavelength stability, linewidth, etc.) of optical source 302 but may have a greater amplitude.

In the example of FIG. 3, each power splitter 314 has a split ratio of 1:2, whereby optical output 313 from child laser 308 is divided by power splitter 314 into two equal output signals, optical source output 312 and injection locking output 316. However, power splitter 314 may have other split ratios without departing from the scope hereof. For example, power splitter 314 may have a ratio of 1:8, 1:16, or 1:32, and so on without departing from the scope hereof, where one or more of the optical source outputs may be used to drive a subsequent child laser 308 or may be used as an optical signal source for components of the coherent optical system. In certain embodiments, the ratio of power splitter 314 is selected based on a required amplitude of optical source output 312; the larger the required amplitude the smaller the ratio of power splitter 314. In certain embodiments, splitter 314(N) may be omitted from the final optical source generator 301(N) of the cascade.

Advantageously, configuration of COIL apparatus 300 is flexible, allowing COIL apparatus 300 to be configured to generate multiple coherent laser sources (e.g., optical source output 312) for signal modulation and may be implemented for multiple fiber links, and/or may be used for single fiber link transmission with multiple modes, or multiple cores.

Although there is no theoretical limit to N (e.g., the number of child lasers 308 that may be cascaded), any degradation, albeit slight, in the quality of output signal 314 is input to the subsequent child laser 308. Accordingly, a practical limit to the number of child lasers 308 that may be cascaded is sixty-four or less depending on the quality required for optical source output 312(N). Advantageously, COIL apparatus 300 reduces cost of equipment in a coherent optical system since the cost of each optical source generator 301 is lower than the cost of using multiple parent lasers 304 to generate the multiple optical source outputs 312.

Figure 4:
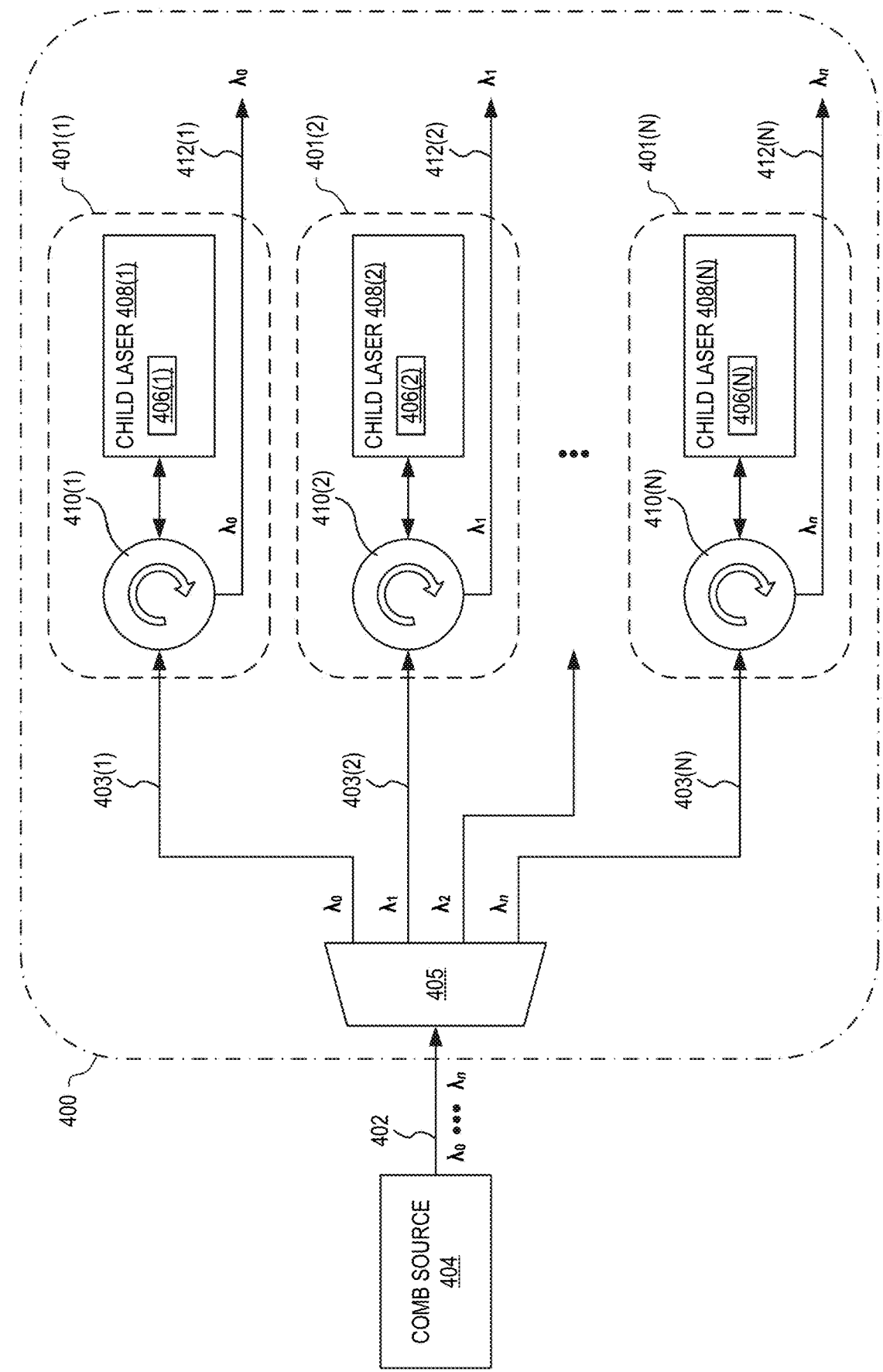
FIG. 4 is a schematic diagram illustrating one example COIL apparatus operating in a shared mode and supporting multiple wavelengths, in embodiments.

FIG. 4 is a schematic diagram illustrating one example COIL apparatus 400 operating in a shared mode and supporting multiple wavelengths. COIL apparatus 400 includes a demultiplexer 405 and a plurality of optical source generators 401. Each optical source generator 401 includes an optical circulator 410 and a child laser 408 with a laser resonator 406. Demultiplexer 405 receives an optical source 402, from an optical frequency-comb generator 404, that includes multiple wavelengths, illustratively shown as $\lambda_0$-$\lambda_n$. For example, optical source 402 may be carried over a single optical fiber. Demultiplexer 405 demultiplexes optical source 402 into a plurality of injection locking signals 403, each including one of the multiple wavelengths of optical source 402. Each optical source generator 401 receives a different optical source 402 that is input into laser resonator 306 via optical circulator 410 to injection lock child laser 408 and output, via optical circulator 410, an optical source output 412. For example, injection locking signal 403(1) with wavelength $\lambda_0$ and is injected into a resonator 406(1) of child laser 408(1) causing child laser 408(1) to generate optical source output 412(1) of wavelength $\lambda_0$; injection locking signal 403(2) has wavelength $\lambda_1$ and is injected into a resonator 406(2) of child laser 408(2) causing child laser 408(2) to generate optical source output 412(2) of wavelength $\lambda_1$; and injection locking signal 403 (N) has wavelength $\lambda_n$ and is injected into a resonator 406(N) of child laser 408(N) causing child laser 408(N) to generate optical source output 412(N) of wavelength $\lambda_n$. Optical source output 412(1) has substantially the same optical characteristics as injection locking signal 403(1) at wavelength $\lambda_0$; optical source output 412(2) has substantially the same optical characteristics as injection locking signal 403(2) at wavelength $\lambda_1$; and optical source output 412(N) has substantially the same optical characteristics as injection locking signal 403(N) at wavelength $\lambda_n$.

The output power of each injection locking signal 403 is in a range required for injection locking of child laser 408. Direct modulation or external modulation may be applied for each optical source output 412. Each optical source generator 401 generates its optical source output 412 to replicate the received injection locking signal 403 such that its optical source output 412 has the same phase, wavelength, wavelength stability, and linewidth as the respective wavelength of optical source 402 but may have a greater amplitude. Accordingly, wavelength division multiplexing on the same fiber may be easily achieved with only a single comb source (e.g., optical frequency-comb generator 404). Advantageously, COIL apparatus 400 facilitates distribution of multiple laser sources and reduces cost of equipment in a coherent optical system since the cost of each optical source generator 401 is lower than the cost of using multiple high-performance parent lasers to generate the multiple optical source outputs 412 at different wavelengths.

Figure 5:
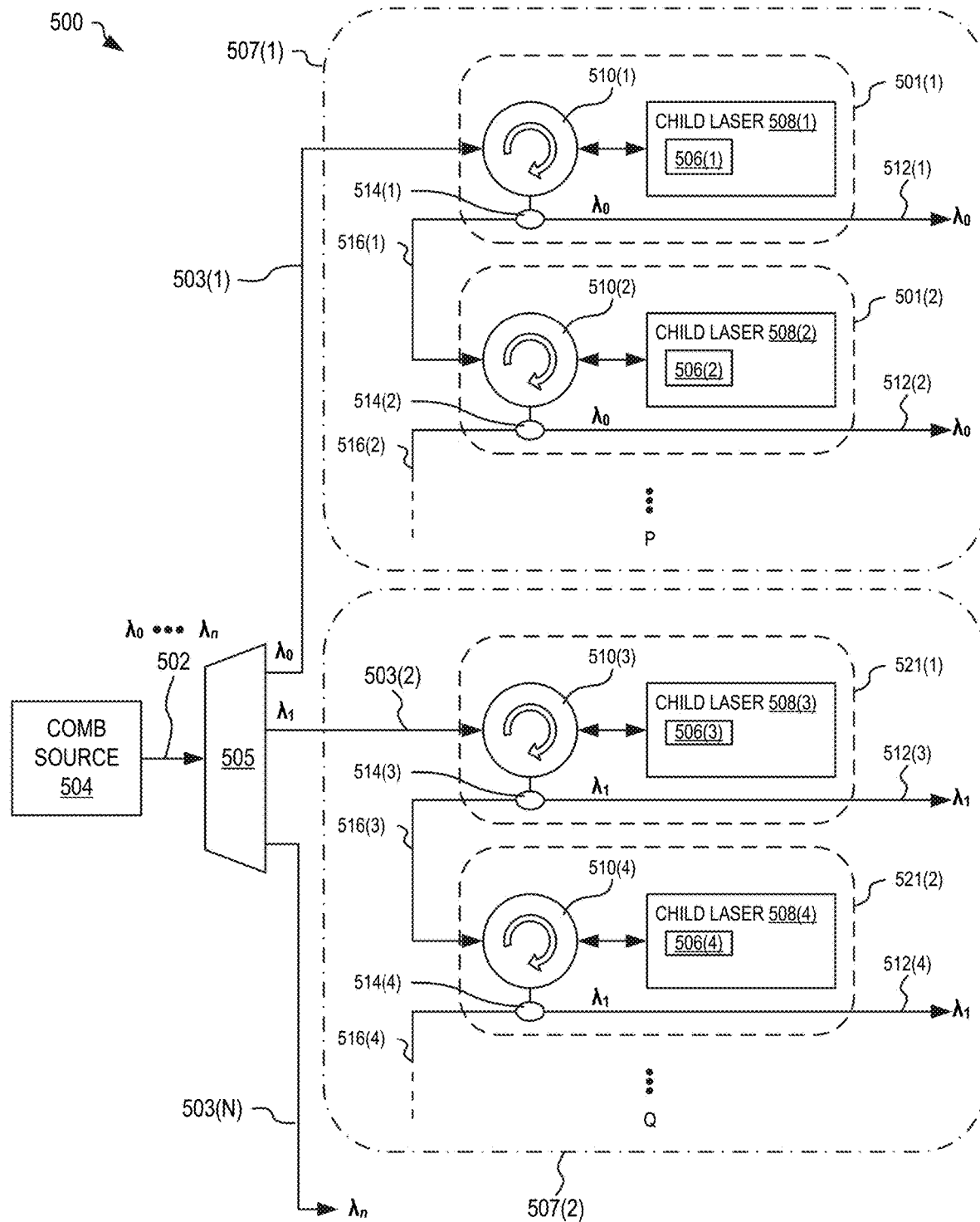
FIG. 5 is a schematic diagram illustrating one example COIL apparatus operating in a combined shared and cascade mode and supporting multiple wavelengths, in embodiments.

FIG. 5 is a schematic diagram illustrating one example COIL apparatus 500 operating in a combined shared and cascade mode and supporting multiple wavelengths. COIL apparatus 500 illustrates flexibility and cost saving for a coherent optical system. COIL apparatus 500 includes a demultiplexer 505 and a plurality of cascade modules 507, where each cascade module 507 includes a plurality of optical source generators 501. Demultiplexer 505 receives an optical source 502, from an optical frequency-comb generator 504 for example, that includes multiple wavelengths $\lambda_0$-$\lambda_n$, and demultiplexes optical source 502 into N injection locking signals 503(1)-(N), each having a different wavelength $\lambda_0$-$\lambda_n$. Accordingly, N is a positive integer defining the number of different wavelengths $\lambda_0$-$\lambda_n$ carried by optical source 502, where N=n+1.

In the example of FIG. 5, cascade module 507(1) receives injection locking signal 503(1) carrying wavelength $\lambda_0$ and includes P optical source generators 501(1)-(P), where P is a positive integer representing the number of optical source outputs 512 having wavelength $\lambda_0$. Cascade module 507(2) receives injection locking signal 503(2) carrying wavelength $\lambda_1$ and includes Q optical source generators 521(1)-(Q), where Q is a positive integer representing the number of optical source outputs 512 having wavelength $\lambda_1$. Each optical source generator 501/521 includes an optical circulator 510, a child laser 508 with a laser resonator 506, and a power splitter 514, and operates similarly to optical source generator 301 of FIG. 3 to generate an optical source output 512 that has substantially the same optical characteristics (e.g., linewidth, and wavelength) as injection locking signal 503 and an injection locking output 516 that is used to injection lock a next child laser 508 if included. Advantageously, each cascade module 507 may be configured with sufficient optical source generators 501/521 to generate a required number of optical source outputs 512. Each optical source generator 501 generates its optical source output 512 to replicate its injection locking signal 503/516 such that its optical source output 512 has the same phase, wavelength, wavelength stability, and linewidth as the respective wavelength of optical source 502 but may have a greater amplitude.

Advantageously, COIL apparatus 500 is configurable to generate any number of optical source outputs 512, at any or all wavelengths $\lambda_0$-$\lambda_n$ of optical source 502. For example, optical source 502 may be provided over a single fiber optic from a hub to at least one fiber node that implements COIL apparatus 500 to generate many different optical source outputs 512 for use within the fiber node and/or for further distribution to many different pieces of end user equipment at the same or different locations. COIL apparatus 500 thereby allows wavelength division multiplexing (WDM) on the same fiber using a single optical frequency-comb generator 504. Further, each optical source outputs 512, generated by a different child laser 508, has sufficient amplitude to allow direct external modulation. Advantageously, COIL apparatus 500 facilitates distribution of multiple laser sources and reduces cost of equipment in a coherent optical system since the cost of each optical source generator 501 is lower than the cost of using multiple parent lasers to generate the multiple optical source outputs 512 at different wavelengths. Yes further, multiple WDM sources may be generated and transmitted over multiple optical fibers, multiple modes, or multiple cores of fiber.

Each of COIL apparatus 200, COIL apparatus 300, COIL apparatus 400 and COIL apparatus 500 may be implemented in one or more photonic integrated circuits that include active components (e.g., parent laser 204/304, optical frequency-comb generator 404/504, and child lasers 208/308/408/508, and passive components such as optical circulator 210/310//410/510, optical power splitter 205/314/514, and optical demultiplexer 405/505.

Wavelength Agnostic

In COIL apparatus 200, 300, 400, and 500, each optical source generator 201, 301, 401, and 501, is substantially wavelength-agnostic (e.g., tunable within a wide operational bandwidth, such as 20 GBaud all the way to 90 GBaud), since injection locking causes the corresponding child laser 208, 308, 408, and 508 to lock onto the wavelength of the input injection locking signal (e.g., injection locking signal 203, optical source 302, injection locking signal 403 and 503, respectively). Accordingly, in certain embodiments, through use of an intelligent wavelength selective switch (IWSS) (e.g., used in place of demultiplexers 405 and 505 for example), the input injection locking signal may be automatically selected based upon certain criteria. For example, in embodiments where COIL apparatus 200, 300, 400, and 500 is used in FSO communication (see FIGS. 8, 9, and 10), the wavelength of one or more input injection locking signals may be automatically selected based on feedback from a receiver of that signal and/or expected atmospheric conditions. That is, through use of the IWSS, characteristics of an optical transmission may be selectively controlled to overcome interfering atmospheric conditions. For example, the optical transmission window may range from 6.75 GHz, 12.5 GHz, 25 GHz, up to 100 GHz, and 150 GHz. Particularly, use of the IWSS allows for a very fast response to changing atmospheric conditions, such that when a communication beam degrades or fails, the IWSS may automatically switch to a different wavelength that is less affected by the prevailing atmospheric conditions. For example, the IWSS may switch any wavelength of the received optical source to any of its outputs such that the corresponding optical injection locking signal causes the connected COIL apparatus to injection lock at that wavelength.

Advantageously, because COIL apparatus 200, COIL apparatus 300, optical source generator 401, and cascade modules 507 of COIL apparatus 500 are wavelength-agnostic, they form convenient building blocks for generating multiple optical sources at a controlled wavelength without requiring circuit modification. That is, since the IWSS may change the wavelength of the injection locking signal (e.g., injection locking signal 203, optical source 302, injection locking signal 403, and/or injection locking signal 503) to a different wavelength, all respective optical source outputs (e.g., optical source outputs 212, 312, 412, and 512) from the respective COIL apparatus (e.g., COIL apparatus 200, COIL apparatus 300, optical source generator 401, and cascade modules 507 of COIL apparatus 500) are changed to the different wavelength. Advantageously, COIL apparatus 200, COIL apparatus 300, optical source generator 401, and COIL apparatus 500 make this wavelength change easier than systems without the COIL apparatus and that use multiple independent optical sources. This reconfigurability makes COIL apparatus 200, 300, 400, 500 a valuable building block for intelligent and adaptable optical systems.

Optical Source Distribution

As noted above, an optical source is critical to performance of a coherent optical system such as a communication network. Accordingly, devices within the communication network use one or more optical sources. Through use of any one or more of COIL apparatus 200, 300, 400 and 500, a single optical source may be distributed throughout a coherent optical system. Further, architecture of each COIL apparatus 200, 300, 400 and 500 may be combined to meet a particular configuration. That is, the shared and cascading architectures may be used with single wavelength optical sources, with multiple wavelength optical sources, and with combinations thereof such as where one optical source output 412 from COIL apparatus 400 is used as injection locking signal 203 for COIL apparatus 200, or COIL apparatus 300. Accordingly, these COIL apparatus provide flexibility and simplification in optical system design, variability (e.g., using IWSS) in use, and cost savings over conventional optical systems.

Figure 6:
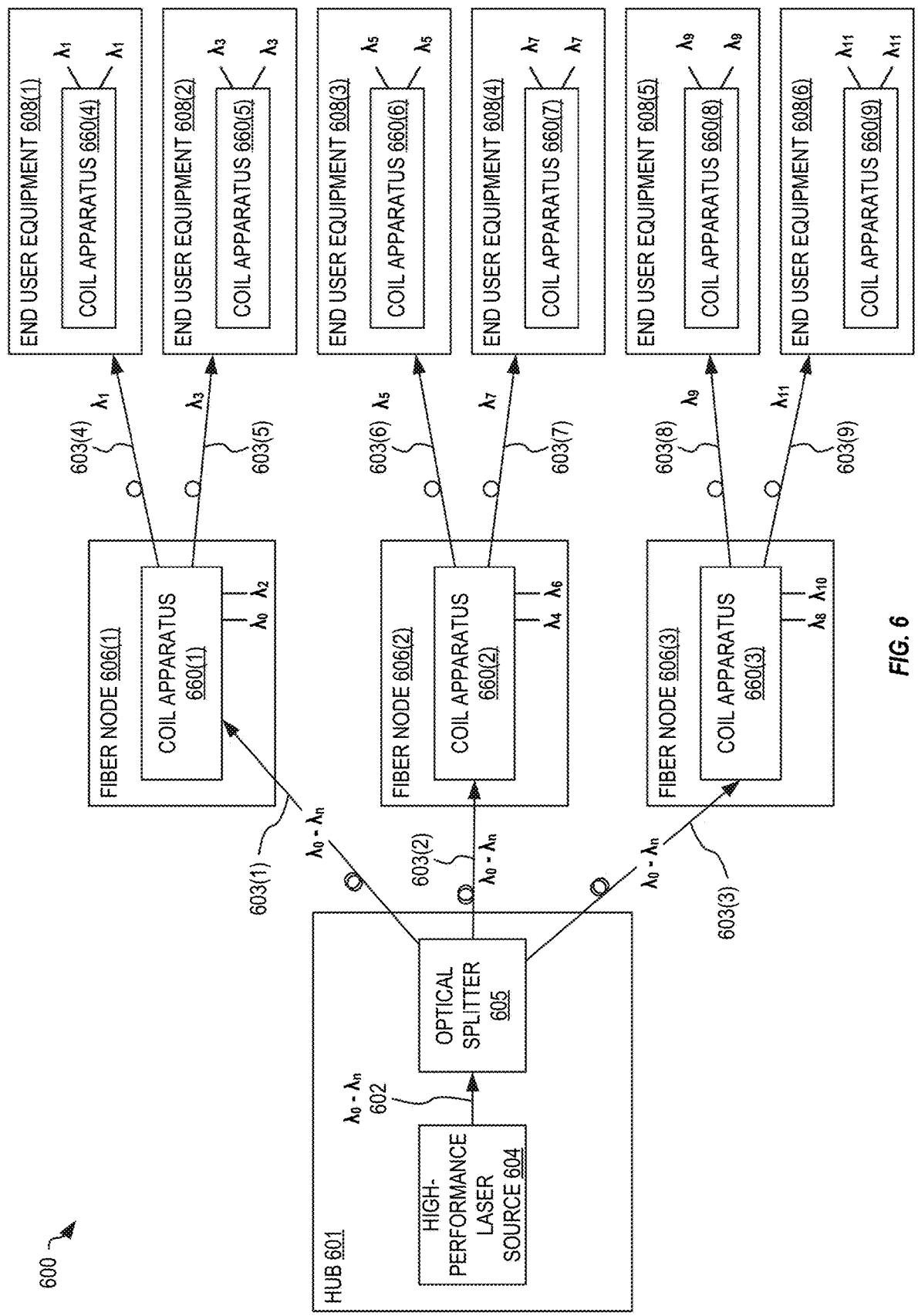
FIG. 6 is a block diagram illustrating example use of COIL apparatus to distribute an optical signal source within a coherent optical system, in embodiments.

FIG. 6 is a block diagram illustrating example use of COIL apparatus 660 to distribute an optical signal source within a coherent optical system 600. System 600 may represent an optical cable network. System 600 includes a hub 601, a plurality of fiber nodes 606(1)-(3), and a plurality of end user equipment 608(1)-(6). System 600 has three fiber nodes 606 and six end user equipment 608 for clarity of illustration but may have more or fewer fiber nodes 606 and end user equipment 608 without departing from the scope hereof. COIL apparatus 660 may represent any one or more of COIL apparatus 200, 300, 400 and 500 of FIGS. 2, 3, 4 and 5, respectively, and/or any combination thereof.

Hub 601 is at a first location and includes a high-performance laser source 604 that generates an optical source 602. In the example of FIG. 6, high-performance laser source 604 is an optical frequency-comb generator and optical source 602 is an optical frequency-comb source that includes multiple wavelengths, illustratively shown as $\lambda_0$-$\lambda_n$. Hub 601 also include an optical power splitter 605 that splits optical source 602 into a plurality of substantially similar optical signals for distribution to fiber nodes 606(1)-(3) via fiber cables 603(1)-(3), as shown.

COIL apparatus 660 may represent any one or more of COIL apparatus 200, 300, 400 and 500. For example, COIL apparatus 660(1) may represent COIL apparatus 400 that replicates wavelengths $\lambda_1$ and $\lambda_3$ of optical source 602 for output to end user equipment 608(1) and end user equipment 608(2), respectively. COIL apparatus 660(2) may represent COIL apparatus 400 that replicates wavelengths $\lambda_5$ and $\lambda_7$ of optical source 602 for output to end user equipment 608(3) and end user equipment 608(4), respectively. COIL apparatus 660(3) may represent COIL apparatus 400 that replicates wavelengths $\lambda_9$ and $\lambda_{11}$ of optical source 602 for output to end user equipment 608(5) and end user equipment 608(6), respectively.

Each COIL apparatus 660(1)-(3) may also replicate certain wavelengths of optical source 602 for use within fiber node 606. For example, optical source 602 may include frequency pairs that are used for bidirectional communication between fiber nodes 606 and end user equipment 608. See for example, phase synchronized coherent tone pairs 166(1), 166(2), ... 166(N) of U.S. Pat. No. 10,623,104 B2, incorporated herein by reference. In the example of FIG. 6, COIL apparatus 660(1) replicates wavelengths $\lambda_0$ and $\lambda_2$ for use within fiber node 606(1), where wavelengths $\lambda_0$ and $\lambda_1$ are a phase synchronized coherent tone pair used over fiber cable 603(4) between fiber node 606(1) and end user equipment 608(1) and wavelengths $\lambda_2$ and $\lambda_3$ are a phase synchronized coherent tone pair used over fiber cable 603(5) between fiber node 606(1) and end user equipment 608(2). COIL apparatus 660(2) replicates wavelengths $\lambda_8$ and $\lambda_6$ for use within fiber node 606(2), where wavelengths $\lambda_4$ and $\lambda_5$ are a phase synchronized coherent tone pair used over fiber cable 603(6) between fiber node 606(2) and end user equipment 608(3) and wavelengths $\lambda_6$ and $\lambda_7$ are a phase synchronized coherent tone pair used over fiber cable 603(7) between fiber node 606(2) and end user equipment 608(4). COIL apparatus 660(3) replicates wavelengths $\lambda_8$ and $\lambda_{10}$ for use within fiber node 606(3), where wavelengths $\lambda_8$ and $\lambda_9$ are a phase synchronized coherent tone pair used over fiber cable 603(8) between fiber node 606(3) and end user equipment 608(5) and wavelengths $\lambda_{10}$ and $\lambda_{11}$ are a phase synchronized coherent tone pair used over fiber cable 603(9) between fiber node 606(3) and end user equipment 608(6).

Within each end user equipment 608(1)-(8), respective COIL apparatus 660(4)-(9) may represent COIL apparatus 300 that replicates the received single wavelength of optical source 602. For example, COIL apparatus 660(4) generates multiple optical sources of wavelength $\lambda_1$ for use within end user equipment 608(1), COIL apparatus 660(5) generates multiple optical sources of wavelength $\lambda_3$ for use within end user equipment 608(2), COIL apparatus 660(6) generates multiple optical sources of wavelength $\lambda_5$ for use within end user equipment 608(3), COIL apparatus 660(7) generates multiple optical sources of wavelength $\lambda_7$ for use within end user equipment 608(4), COIL apparatus 660(8) generates multiple optical sources of wavelength $\lambda_9$ for use within end user equipment 608(5), and COIL apparatus 660(9) generates multiple optical sources of wavelength $\lambda_{11}$ for use within end user equipment 608(6). Advantageously, each optical source generated by COIL apparatus 660 are all coherent, since they are all generated from the same single optical source 602.

Figure 7:
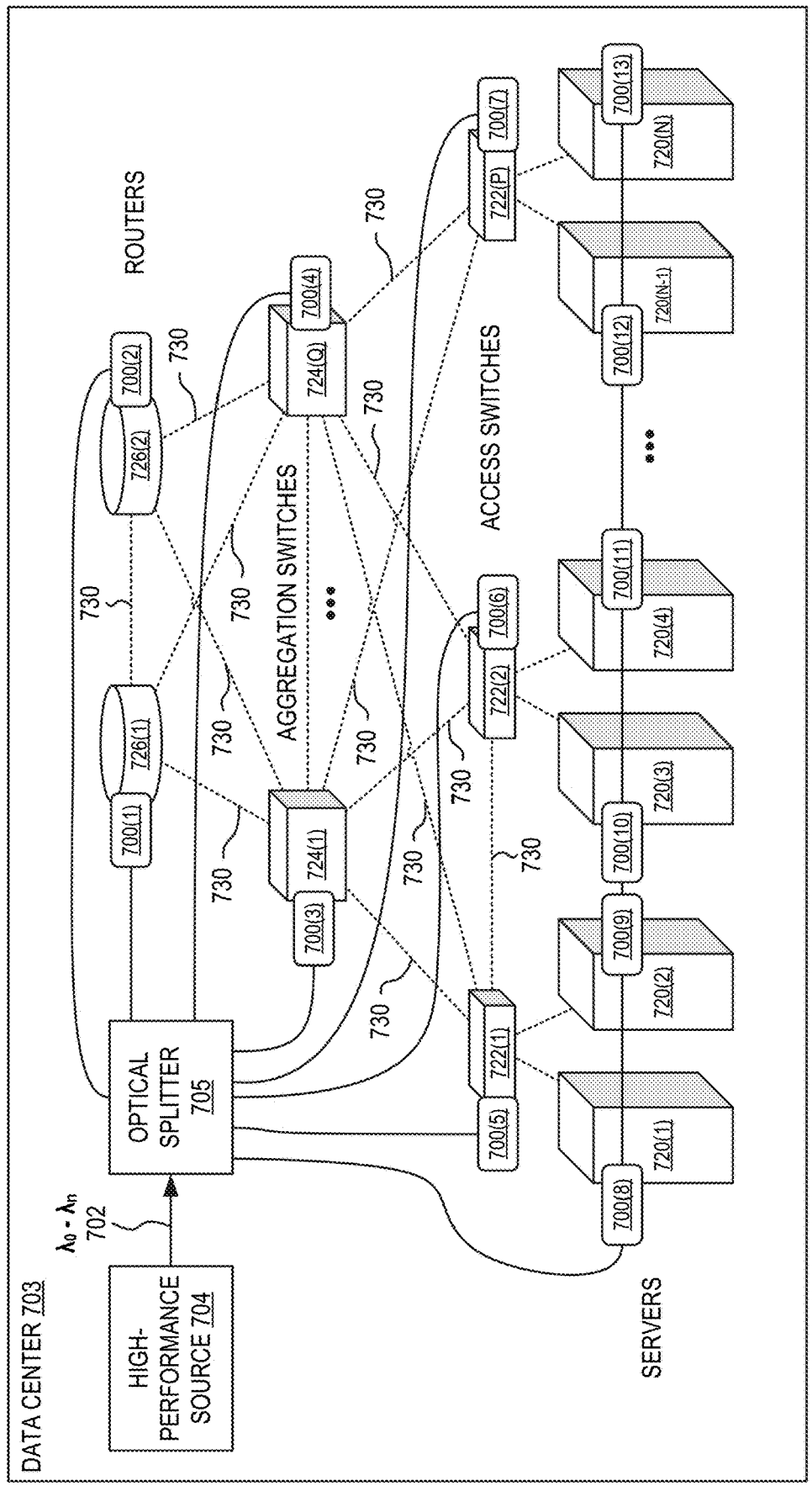
FIG. 7 is a schematic diagram illustrating example use of COIL apparatus within a data center, in embodiments.

FIG. 7 is a schematic diagram illustrating example use of COIL apparatus 700 within a data center 703. Optical communication is essential for the high bandwidth required within data center. Conventionally, multiple high-performance lasers were implemented in many devices of the data center. For example, communication within a data center may use dense wavelength division multiplexing (DWDM) for peer-to-peer (P2P) communication where between 50 and 100 laser sources are used over a single fiber cable. A goal of any data center is to reduce the cost of the optical bit. As shown in FIG. 7, COIL apparatus 700 allows data center 703 to use a single high-performance source 704 (e.g., a high-performance laser), whereby COIL apparatus 700 generates a number of optical sources at the required wavelength within each component 720, 722, 724, and 726 of the data center 703 as needed. COIL apparatus 700 may represent any one or more of COIL apparatus 200, 300, 400 and 500 of FIGS. 2, 3, 4 and 5, respectively.

COIL apparatus 700 is particularly valuable within data center 703 since each component 720, 722, 724, and 726 typically supports many communication channels and that uses many optical sources. Data center 703 is shown as an example and may include other components and structure without departing from the scope hereof.

High-performance source 704 generates an optical comb source 702 containing multiple wavelengths $\lambda_0$-$\lambda_n$ that is distributed, via an optical splitter 705 and fiber cables for example, to components within data center 703 that use optical communication. In certain embodiments, optical splitter 705 may implement COIL apparatus 200 of FIG. 2. Data center 703 includes a plurality of servers 720(1)-(N), a plurality of access switches 722(1)-P, a plurality of aggregation switches 724(1)-(Q), and two routers 726(1) and 726(2). Each of these components is interconnected by at least one optical communication channel 730, where multiple channels may use different wavelengths over the same optical fiber. Accordingly, at each component 720, 722, 724, and 726, COIL apparatus 700 implements COIL apparatus 400 and/or 500 to replicate specific wavelengths from optical comb source 702, and to provide generated optical sources to the transceivers as required. Advantageously, the components 720, 722, 724, and 726 do not require individual high-performance laser sources since COIL apparatus 700 may provide optical sources, at any wavelength included in optical comb source 702, that are directly used by optical communication transceivers within the data center component.

Advantageously, the cost and power requirement for COIL apparatus 700, as compared to using many high-performance laser sources, is reduced, thereby reducing the cost of the optical bit in data center 703. Further, where two or more data centers 703 are optically networked together, one data center may act as a parent data center that includes single high-performance source 704 and generates optical comb source 702 for distribution over fiber cables to the other data centers. The receiving datacenter may select one wavelength from optical comb source 702 as a primary wavelength, and/or may use multiple wavelengths as needed, replicating each needed wavelength using COIL apparatus 700.

Figure 8:
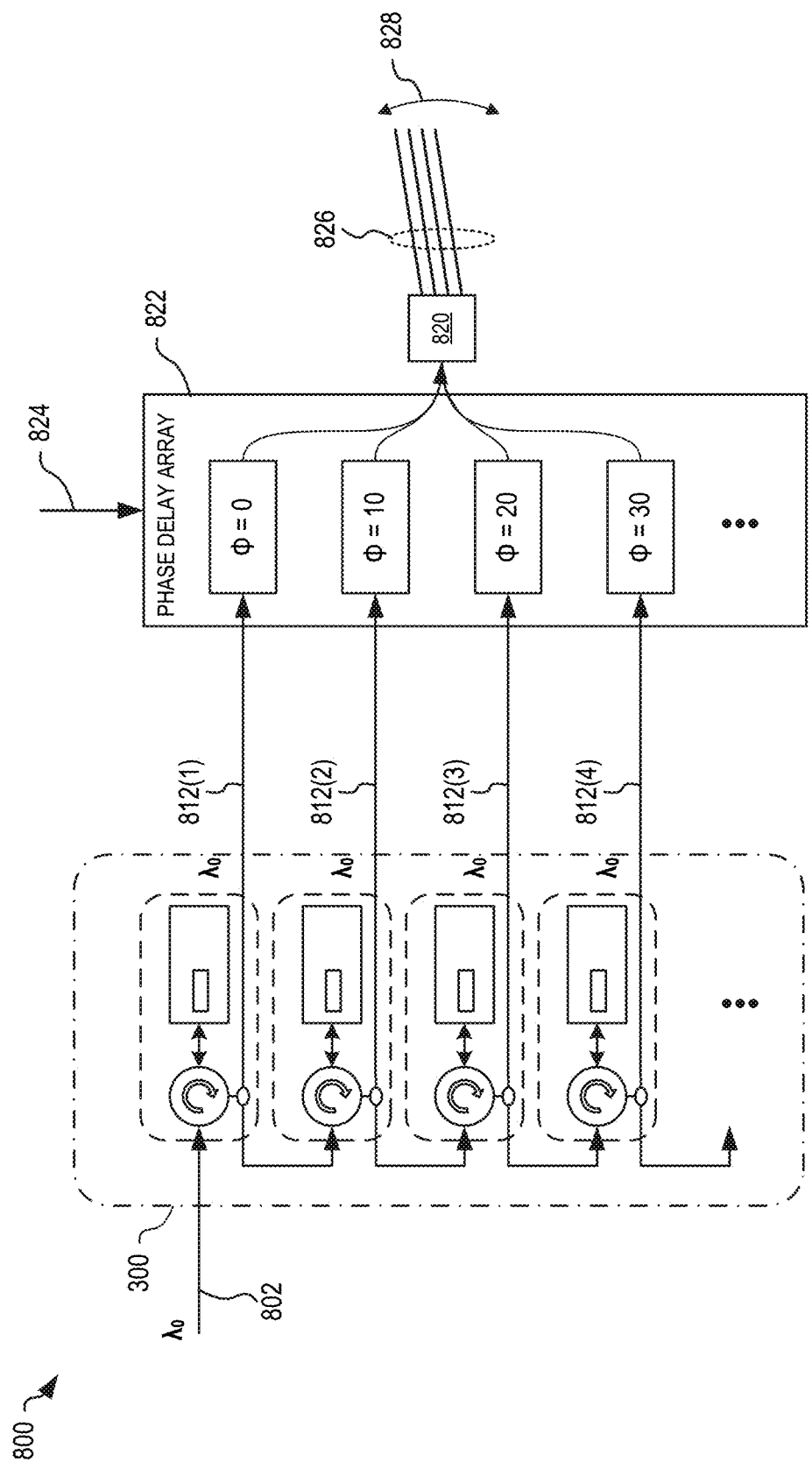
FIG. 8 is a schematic diagram illustrating one example free-space optical (FSO) communication transmitter using the COIL apparatus of FIG. 3, in embodiments.

FIG. 8 is a schematic diagram illustrating one example free-space optical (FSO) communication transmitter 800 using COIL apparatus 300 of FIG. 3, in embodiments. A single wavelength optical source 802 (e.g., received from a single high-performance laser source such as high-performance parent laser 304) is input to COIL apparatus 300, which generates many optical source outputs 812. Advantageously, optical source outputs 812 all have the same wavelength and are in phase since they are all generated from the same optical source 802. Accordingly, optical source outputs 812 may be used to drive an optical antenna 820 via a phase delay array 822 that applies individual phase delays to each optical source output 812, based on a steering input 824 for example, such that an optical communication beam 826 emitted into free optical space from optical antenna 820 is steered, as indicated by arrow 828.

In one embodiment, multiple optical source outputs 812 are similarly modulated and transmitted through free space as multiple beams, each carrying the same data. The detector detects and joins these multiple beams to recover the data. Since the transmitted beams are coherent (e.g., generated from the same optical source), the receive joins may easily join the received signals to improve transmission quality, thereby overcoming atmospheric interference. For example, two-thousand optical source outputs 812 are each modulated to carry the same 100 Gb/s data stream. If ten of these two-thousand beams reach a receiver, the receiver can decode the data. Further, since all optical source outputs 812 are coherent and are carrying the same data, the receiver may joint process the received beams to improve transmission quality. Clearly, through use of COIL apparatus 300, the cost of generating two-thousand optical source outputs is considerable reduced. In this example, the FSO communication has a bandwidth of 100 Gb/s.

In another embodiment, multiple optical source outputs 812 are each modulated to carry a different portion of the data at a more relaxed modulation, each contributing to the total bandwidth of the FSO communication. For example, ten optical source outputs 812 are each modulated to carry a different 10 Gb portion of a 100 Gb/s data stream. Accordingly, each resultant beam has a more relaxed modulation, as compared to a beam carrying 100 Gb/s of data, that is less affected by atmospheric interference and thereby more likely to be successfully decoded. An optical receiver decodes one 10 Gb/s portion from each received beam to reconstruct the 100 Gb/s data stream.

Figure 9:
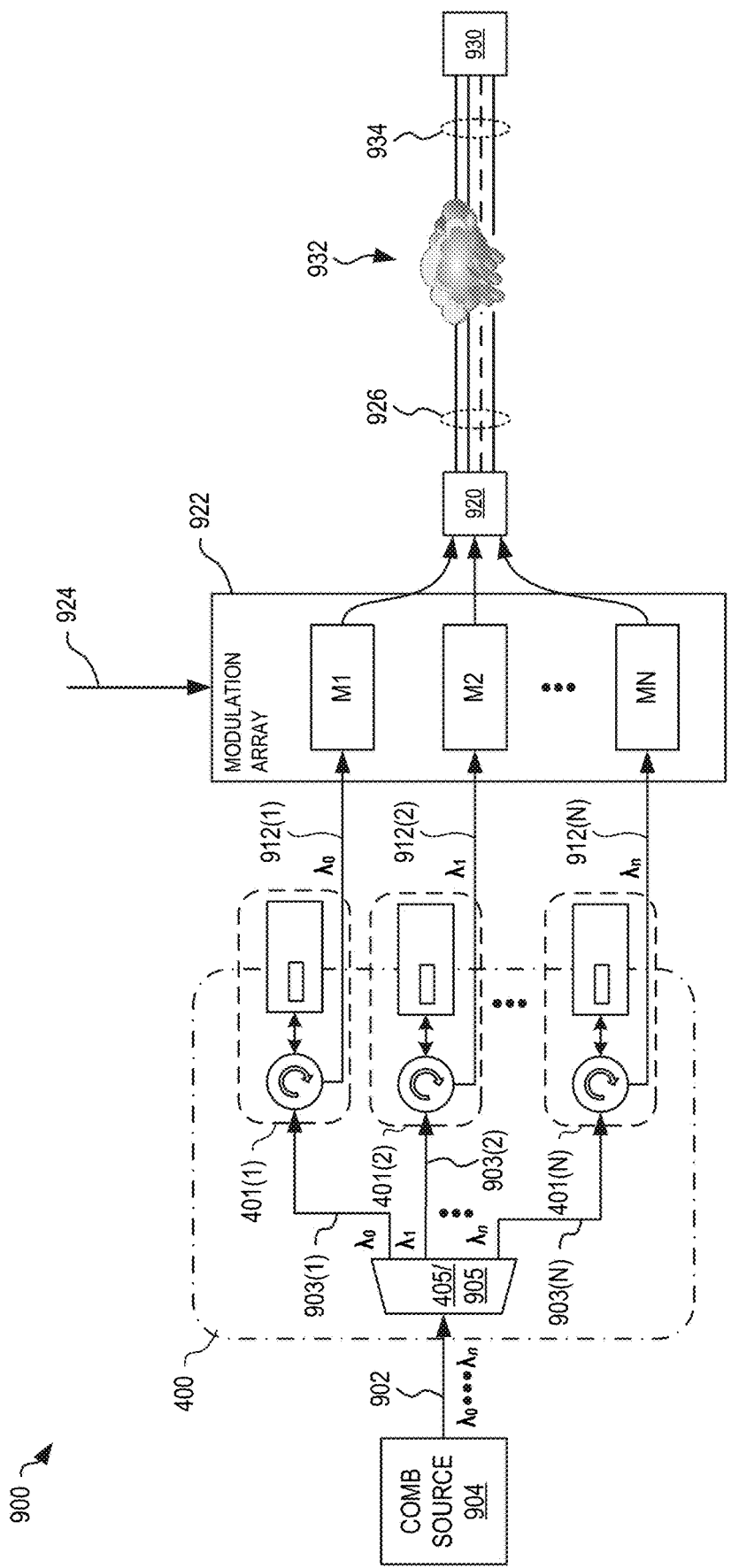
FIG. 9 is a schematic diagram illustrating one example FSO communication transmitter using the COIL apparatus of FIG. 4, in embodiments.

FIG. 9 is a schematic diagram illustrating one example free-space optical (FSO) communication transmitter 900 using COIL apparatus 400 of FIG. 4, in embodiments. A single optical comb source 902 (e.g., received from a single high-performance laser comb source 904) is input into COIL apparatus 400 to generate many optical source outputs 912, each at a different one of the wavelengths included within optical comb source 902. Each optical source outputs 912 drives an optical antenna 920 via a modulation array 922. Modulation array 922 modulates each optical source output 912, based on data input 924 for example, such that a communication beam 926 is emitted into free optical space from optical antenna 920 and directed towards an optical receive antenna 930. Communication beam 926 experiences interference by various atmospheric conditions 932 such that a degraded communication beam 934 is received by optical receive antenna 930. Atmospheric conditions 932 cause differing amounts of interference based on the wavelength of communication beam 926. Advantageously, through use of COIL apparatus 400 to generate multiple optical source outputs 912 at different wavelengths, communication beam 926 has improved transmission through atmospheric conditions 932 as compared to a beam at a single wavelength. For example, where atmospheric conditions 932 blocks wavelength $\lambda_1$, other wavelengths may be less affected and therefore degraded communication beam 934 received by optical receive antenna 930 still contains sufficient information to enable the receiver to decode input data 924.

In certain embodiments, COIL apparatus 400 includes an IWSS 905, in place of demultiplexer 405, that intelligently switches wavelengths of each injection locking signal 903 in response to feedback, from optical receive antenna 930 (or the corresponding receiver/decoder) for example, to dynamically adjust the frequencies used for communication beam 926 and thereby reduce effects of atmospheric interference on communication beam 926. For example, the feedback indicates a receive strength of each wavelength of the degraded communication beam 934.

Advantageously, through use of COIL apparatus 300 in the example of FIG. 8 and COIL apparatus 400 in the example of FIG. 9, the required optical sources 812/912 are easily generated from a single optical source, thereby reducing the cost of FSO communication.

Figure 10:
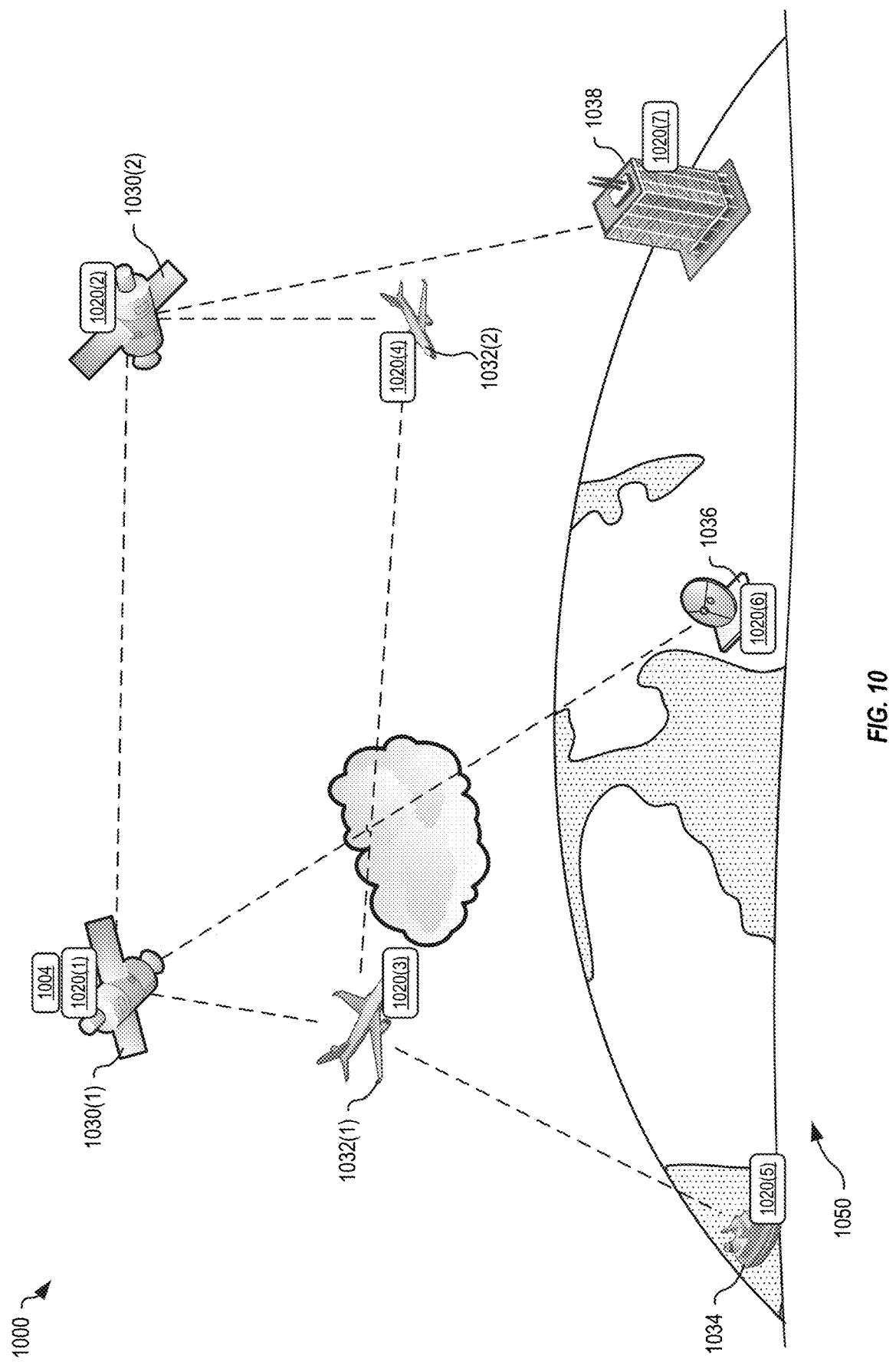
FIG. 10 is a schematic diagram illustrating an example mobile FSO communication scenario that uses a COIL apparatus to generate, from a single optical source, multiple optical sources that drive FSO communication between multiple mobile devices, in embodiments.

FIG. 10 is a schematic diagram illustrating an example mobile FSO communication scenario 1000 that uses COIL apparatus 1020 to generate, from a single optical source, multiple optical sources that drive FSO communication between multiple mobile devices, in embodiments. Mobile FSO communication scenario 1000 includes satellites 1030(1) and 1030(2) orbiting Earth 1050, aircraft 1032(1) and 1032(2) flying above Earth 1050, a ship 1034 at sea on Earth 1050, a stationary land station 1036, and a building 1038. Each mobile devices 1030, 1032, 1034 and stationary devices 1036 and 1038 include FSO communication capability. Satellites 1030 may be in one or more of low earth orbit (LEO), medium-earth orbit (EO) and geostationary orbit (GEO), and thereby intersatellite FSO communication is without atmospheric effects. Although mobile FSO communication scenario 1000 shows two satellites 1030, two aircraft 1032, one ship 1034, one stationary land station 1036, and one building 1038, more or fewer satellites, aircraft, ships, ground stations and building may be included in the communication network without departing from the scope hereof.

Satellite 1030(1) operates as a parent satellite and includes an optical frequency-comb generator 1004 that generates an optical source that includes multiple wavelengths. Satellite 1030(1) also include a COIL apparatus 1020(1) that generates multiple optical sources for use by equipment of satellite 1030(1). Satellite 1030(1) also shares the optical source with satellite 1030(2) (e.g., a child satellite) by transmitting the optical source to satellite 1020(2). Satellite 1030(2) includes a COIL apparatus 1020(2) that generates multiple optical sources for use by equipment of satellite 1030(2). COIL apparatus 1020(1) and COIL apparatus 1020(2) may each represent any one or more of COIL apparatus 200, FIG. 2, COIL apparatus 300, FIG. 3, COIL apparatus 400 FIG. 4, and COIL apparatus 500 FIG. 5, as needed by equipment on each satellite. In scenario 1000, since satellite 1030(1) includes optical frequency-comb generator 1004, COIL apparatus 1020(1) may represent COIL apparatus 500 that generates multiple optical sources at each of multiple wavelengths.

Satellite 1030(2) (e.g., child satellites) may also send the received optical source to other satellites. Accordingly, the single optical source is propagated between devices of the FSO network. That is, each child satellite (e.g., satellite 1030(2)) may act like a parent satellite to other child satellites. Advantageously, through use of COIL apparatus 1020(1) and 1020(2), only one optical frequency-comb generator 1004 is required for FSO communication between satellites 1030.

Similarly, parent satellite 1030(1) may send the optical source generated by optical frequency-comb generator 1004 to one or more of aircraft 1032(1), 1032(2), ship 1034, ground station 1036, and building 1038. Each aircraft 1032(1), 1032(2), ship 1034, ground station 1036, and building 1038 also include COIL apparatus 1020(3)-(7), respectively, that generate multiple local optical sources for use by optical equipment therein. Since only one optical source 1004 is required, the cost of other equipment in the optical communication network is reduced as compared to equipment using multiple optical source generators.

Further, as described above, the use of IWSS with each the wavelength-agnostic optical source generator within COIL apparatus 200, 300, 400, and 500 allows greater dynamic adaptability of the optical system to counter atmospheric interference, signal blocking, and so on.

Figure 11:
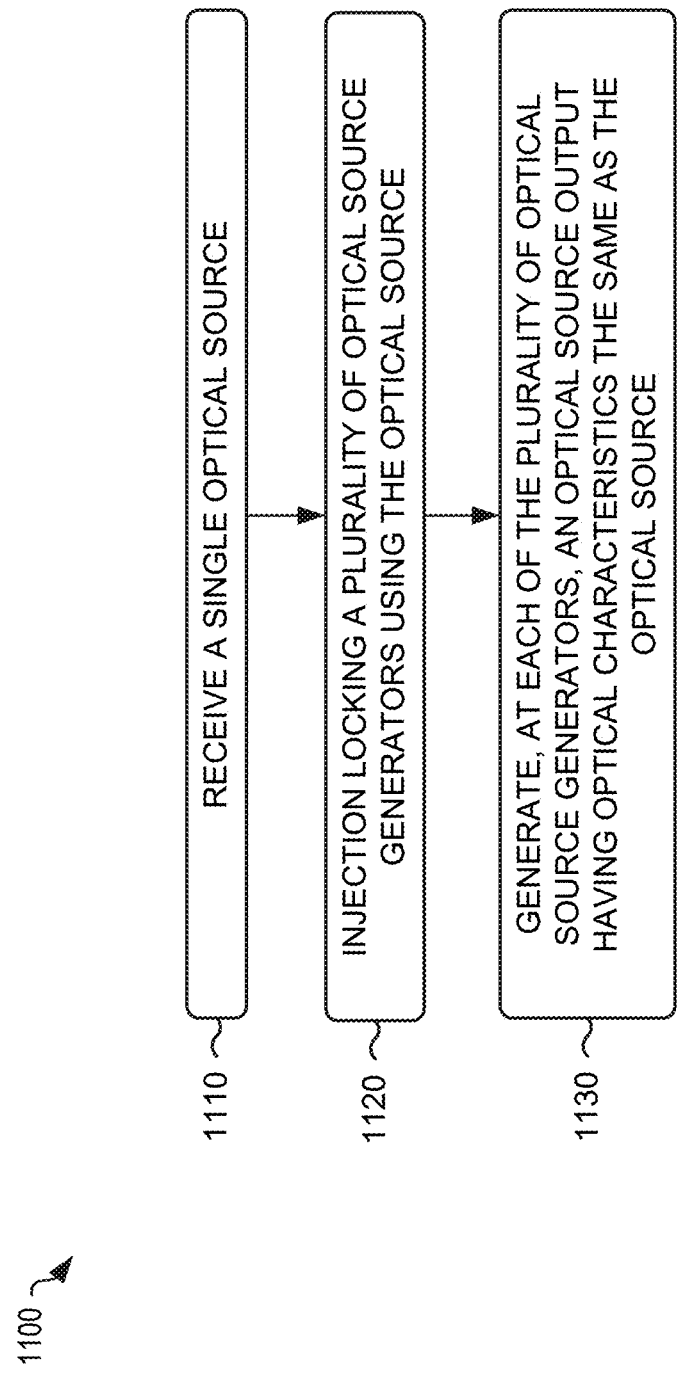
FIG. 11 is a flowchart illustrating one example method of injection locking for multiple optical sources, in embodiments.

FIG. 11 is a flowchart of one example method 1100 of injection locking for multiple optical source generation. In some implementations, one or more process blocks of FIG. 11 may be performed by a COIL apparatus (e.g., COIL apparatus 200, 300, 400, 500 of FIGS. 2, 3, 4 and 5, respectively). In some implementations, one or more process blocks of FIG. 11 may be performed by another device, or a group of devices, separate from or including the COIL apparatus.

As shown in FIG. 11, process 1100 may include receiving a single optical source (block 1110). For example, the COIL apparatus may receive a single optical source, as described above.

As further shown in FIG. 11, process 1100 may include injection locking a plurality of optical source generators using the optical source (block 1120). For example, the COIL apparatus may injection locking a plurality of optical source generators using the optical source, as described above.

As further shown in FIG. 11, process 1100 may include generating, at each of the plurality of optical source generators, an optical source output having optical characteristics the same as the optical source (block 1130). For example, the COIL apparatus may generate, at each of the plurality of optical source generators, an optical source output having optical characteristics the same as the optical source, as described above.

Process 1100 may include additional implementations, such as any single implementation or any combination of implementations described below and/or in connection with one or more other processes described elsewhere herein.

In a first implementation, process 1100 includes splitting the optical source into a plurality of similar injection locking signals and feeding a different one of the similar injection locking signals into a respective one of the plurality of optical source generators.

In a second implementation, process 1100 includes feeding, via a first optical circulator of a first optical source generator of the plurality of optical source generators, the optical source into a resonator of a child laser of the first optical source generator to generate a first optical output, splitting the first optical output, using an optical power splitter, into a first optical source output and a first injection locking output, and feeding the first injection locking output into a next one of the plurality of optical source generators.

In a third implementation, process 1100 includes demultiplexing the optical source into a plurality of injection locking signals each having a different wavelength and feeding a different one of the plurality of injection locking signals into a respective one of the plurality of optical source generators.

In a fourth implementation, process 1100 includes demultiplexing at least a first wavelength and a second wavelength of the optical source into a respective first injection locking signal and a second injection locking signal, and feeding, via a first optical circulator of a first optical source generator of the plurality of optical source generators, the first injection locking signal into a first resonator of a first child laser of the first optical source generator to generate a first optical output at the first wavelength, splitting the first optical output, using a first optical power splitter of the first optical source generator, into a first optical source output and a first injection locking output, feeding, via a second optical circulator of a second optical source generator of the plurality of optical source generators, the first injection locking output into a second resonator of a second child laser of the second optical source generator to generate a second optical output at the first wavelength, feeding, via a third optical circulator of a third optical source generator of the plurality of optical source generators, the second injection locking signal into a third resonator of a third child laser of the third optical source generator to generate a third optical output at the second wavelength, splitting the third optical output, using a second optical power splitter of the third optical source generator, into a third optical source output and a second injection locking output, and feeding, via a fourth optical circulator of a fourth optical source generator of the plurality of optical source generators, the second injection locking output into a fourth resonator of a fourth child laser of the fourth optical source generator to generate a fourth optical output at the second wavelength.

Although FIG. 11 shows example blocks of process 1100, in some implementations, process 1100 may include additional blocks, fewer blocks, different blocks, or differently arranged blocks than those depicted in FIG. 11. Additionally, or alternatively, two or more of the blocks of process 1100 may be performed in parallel.

CONCLUSION

COIL apparatus 200, 300, 400, 500 of FIGS. 2, 3, 4 and 5, respectively, generate multiple optical sources in a low-cost way from a single high-quality/high-performance optical source. Although the above examples illustrate direct detection or coherent optical communication systems, these optical sources may also be used on other applications. For example, COIL apparatus 200, 300, 400, 500, may be used to generate coherent sources for any of optical sensors, photonic phased array, and LiDAR systems.

Although described with reference to coherent optical systems, these techniques may apply to any source signal in the range of 100 GHz to 1 THz. However, such techniques may also apply to lower frequency ranges (e.g., 10 GHz to 100 GHz) that use injection locking. The disclosed COIL apparatus may also be applicable for millimeter wave devices operating at 100 GHz-200 GHz, as used for 6G radio frequency communication. Comb sources typically operate at higher frequencies.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

What is claimed is:

1. Coherent optical injection locking (COIL) system, comprising:
   a plurality of optical source generators each having:
   a child laser; and
   an optical circulator coupled with the child laser to direct one injection locking signal of a plurality of injection locking signals to the child laser to cause the child laser to generate an optical source output that replicates the one injection locking signal,
   a first of the plurality of optical source generators receiving a single wavelength optical source as the one injection locking signal, the first of the plurality of optical source generators further comprising a first power splitter coupled with the respective optical circulator to split a first optical output from the respective child laser to form the respective optical source output and a second of the plurality of injection locking signals, wherein the second of the plurality of injection locking signals is fed into a second of the plurality of optical source generators.

2. The COIL system of claim 1, the optical source generator operating with any wavelength in the range of 10 GHz to 1 THz.

3. The COIL system of claim 1, further comprising an optical power splitter that splits the single wavelength optical source into the plurality of injection locking signals.

4. The COIL system of claim 3, the single wavelength optical source being generated by an external cavity laser (ECL), the child laser comprising a Fabry-Perot laser diode.

5. The COIL system of claim 1, wherein the second of the plurality of optical source generators further comprises a second power splitter coupled with the respective optical circulator to split a second optical output from the respective child laser to form the respective optical source output and a third of the plurality of injection locking signals.

6. The COIL system of claim 1, further comprising an optical demultiplexer for demultiplexing an optical comb source to form the plurality of injection locking signals, each having one of a plurality of different wavelengths of the optical comb source, wherein each of the optical source generators generating a respective optical source output that replicates a different one of the plurality of wavelengths.

7. The COIL system of claim 6, the optical demultiplexer comprising an intelligent wavelength selective switch (IWSS) for dynamically selecting at least one of the plurality of wavelengths of the optical comb source for output as the plurality of injection locking signals.

8. Coherent optical injection locking (COIL) system, comprising:
   a plurality of optical source generators each having:
   a child laser; and
   an optical circulator coupled with the child laser to direct one of a plurality of injection locking signals to the child laser to cause the child laser to generate an optical source output that replicates the one injection locking signal; and
   an optical demultiplexer for demultiplexing (a) a first of a plurality of different wavelengths of an optical comb source to form a first of the plurality of injection locking signals and (b) a second of a plurality of different wavelengths of an optical comb source to form a second of the plurality of injection locking signals;
   each of the plurality of optical source generators further comprising a power splitter coupled with the optical circulator;
   the plurality of optical source generators forming at least a first cascaded group and a second cascaded group;
   a first optical source generator of the first cascaded group being coupled with the optical demultiplexer to receive the first of the plurality of injection locking signals, the power splitter splitting an optical output from the child laser to form the optical source output and one of the plurality of injection locking signals coupled to a second optical source generator of the first cascaded group; and
   a first optical source generator of the second cascaded group being coupled with the optical demultiplexer to receive the second of the plurality of injection locking signals, the power splitter splitting an optical output from the child laser to form the optical source output and another one of the plurality of injection locking signals coupled to a second optical source generator of the second cascaded group.

9. An injection locking method for multiple optical sources, comprising:
   receiving a single optical source;
   injection locking a plurality of optical source generators using the optical source; and
   generating, at each of the plurality of optical source generators, an optical source output having optical characteristics the same as the optical source;
   feeding, via a first optical circulator of a first optical source generator of the plurality of optical source generators, the optical source into a resonator of a child laser of the first optical source generator to generate a first optical output;
   splitting the first optical output, using an optical power splitter, into a first optical source output and a first injection locking output; and
   feeding the first injection locking output into a second of the plurality of optical source generators.

10. The method of claim 9, the steps of receiving, injection locking, and generating being implemented by a coherent optical injection locking system.

11. The method of claim 9, further comprising:
    splitting the optical source into a plurality of similar injection locking signals; and
    feeding a different one of the similar injection locking signals into a respective one of the plurality of optical source generators.

12. The method of claim 9, further comprising:
    demultiplexing the optical source into a plurality of injection locking signals each having a different wavelength; and
    feeding a different one of the plurality of injection locking signals into a respective one of the plurality of optical source generators.

13. An injection locking method for multiple optical sources, comprising:
    receiving a single optical source;
    injection locking a plurality of optical source generators using the optical source;
    generating, at each of the plurality of optical source generators, an optical source output having optical characteristics the same as the optical source;

demultiplexing at least a first wavelength and a second wavelength of the optical source into a respective first injection locking signal and a second injection locking signal;

feeding, via a first optical circulator of a first optical source generator of the plurality of optical source generators, the first injection locking signal into a first resonator of a first child laser of the first optical source generator to generate a first optical output at the first wavelength;

splitting the first optical output, using a first optical power splitter of the first optical source generator, into a first optical source output and a first injection locking output;

feeding, via a second optical circulator of a second optical source generator of the plurality of optical source generators, the first injection locking output into a second resonator of a second child laser of the second optical source generator to generate a second optical output at the first wavelength;

feeding, via a third optical circulator of a third optical source generator of the plurality of optical source generators, the second injection locking signal into a third resonator of a third child laser of the third optical source generator to generate a third optical output at the second wavelength;

splitting the third optical output, using a second optical power splitter of the third optical source generator, into a third optical source output and a second injection locking output; and feeding, via a fourth optical circulator of a fourth optical source generator of the plurality of optical source generators, the second injection locking output into a fourth resonator of a fourth child laser of the fourth optical source generator to generate a fourth optical output at the second wavelength.

\* \* \* \* \*